(12) United States Patent
Vom Stein

(10) Patent No.: US 11,515,867 B2
(45) Date of Patent: Nov. 29, 2022

(54) DEVICE FOR DETECTING THE WIRING AT A SAFETY INPUT

(71) Applicant: Turck Holding GmbH, Halver (DE)

(72) Inventor: Johannes Vom Stein, Hückeswagen (DE)

(73) Assignee: Turck Holding GmbH, Halver (DE)

( * ) Notice: Subject to any disclaimer, the term of this patent is extended or adjusted under 35 U.S.C. 154(b) by 5 days.

(21) Appl. No.: 16/927,215

(22) Filed: Jul. 13, 2020

(65) Prior Publication Data

US 2021/0021260 A1 Jan. 21, 2021

(30) Foreign Application Priority Data

Jul. 15, 2019 (DE) .......................... 102019119066.5

(51) Int. Cl.
*H03K 17/00* (2006.01)
*H03K 17/66* (2006.01)

(52) U.S. Cl.
CPC ......... *H03K 17/002* (2013.01); *H03K 17/661* (2013.01)

(58) Field of Classification Search
CPC .... H03K 17/002; H03K 17/661; H03K 17/18; H03K 17/693
See application file for complete search history.

(56) References Cited

U.S. PATENT DOCUMENTS

| | | | | |
|---|---|---|---|---|
| 4,602,169 A | * | 7/1986 | Shimizu | H04B 1/1027 327/63 |
| 7,746,668 B2 | * | 6/2010 | Weinert | H03F 3/45475 363/15 |
| 9,851,387 B2 | * | 12/2017 | Acena | G01R 31/005 |

FOREIGN PATENT DOCUMENTS

| | | |
|---|---|---|
| DE | 102013112488 A1 | 5/2015 |
| DE | 102014111996 A1 | 2/2016 |
| DE | 102016114384 A1 | 2/2018 |

* cited by examiner

*Primary Examiner* — Ryan Johnson
*Assistant Examiner* — Colleen J O'Toole
(74) *Attorney, Agent, or Firm* — Whitmyer IP Group LLC

(57) ABSTRACT

A device for hooking up a signal-outputting mechanism with two potential sensors each of which has allocated to it two evaluation terminals, wherein the potentials of the evaluation terminals depend inversely on the resistances between the respective evaluation terminals.

12 Claims, 5 Drawing Sheets

|  | 1 | 2 | 3 | 4 | 5 |
|---|---|---|---|---|---|
| PFC unsafe | 0 | 1 | (0) | 0 | 1 |
| PFC safe | 1 | 0 | (0) | 0 | 0 |
| PFC fault | 1 | 1 | (0) | 0 | 1 |
|  | 0 | 0 | (0) | 0 | 1 |
|  | 0 | 1 | (0) | 1 | 1 |
|  | 0 | 1 | (0) | 0 | 0 |

Table 1

Fig. 4

|  | 1 | 2 | 3 | 4 | 5 |
|---|---|---|---|---|---|
| OSSD unsafe | 1 | 1 | 0 | 1 | (0) |
| OSSD safe | 1 | 0 | 0 | 0 | (0) |
| OSSD fault | 1 | 0 | 0 | 1 | (0) |
|  | 1 | 1 | 0 | 0 | (0) |

Table 2

Fig. 5

|  | 1 | 2 | 3 | 4 | 5 |
|---|---|---|---|---|---|
| SM unsafe | 0 | 1 | 1 | 0 | 1 |
| SM safe | 1 | 1 | 1 | 1 | 1 |
| SM fault | 1 | 1 | 1 | 0 | 1 |
|  | 1 | 1 | 1 | 1 | 0 |
|  | 0 | 1 | 1 | 1 | 1 |
|  | 1 | 0 | 1 | 0 | 0 |

Table 3

Fig-6

DEVICE FOR DETECTING THE WIRING AT A SAFETY INPUT

TECHNICAL FIELD

The invention relates to a device for connecting a safety switch or safety device, or optionally a safety switch or safety device. The device has a circuit with input terminals, to which the outputs of such mechanisms can be connected. The potentials applied to the terminals of the device can be read out by an evaluator. The evaluator can determine whether the mechanisms are in a safe state or an unsafe state.

BACKGROUND

A device of the kind described at the outset is used in machines or the like to increase operating safety. For example, a safety switch can be an emergency off switch, which has two potential-free contacts. The potential-free contacts are mechanically designed in such a way that both channels are simultaneously opened or simultaneously closed during an activation. If only one of the two channels assumes a state that is stable over time, this is evaluated as an error, which must bring the system into the safe state.

Further provided are safety devices such as light barriers or light curtains. The latter have an output, to which a permanent or pulsed potential is applied, which changes from one to zero (HI to LO) when the safety state changes. For purposes of intrinsic safety, it is here also provided that the safety devices have two equivalent outputs, which simultaneously change their potential. If the outputs assume different potentials for a certain period of time, this is an indicator that the system is not operating properly.

SUMMARY

The object of the invention is to further develop a circuit for connecting a safety switch or a safety device in terms of safety.

The object is achieved by the invention indicated in the claims, wherein the subclaims are not just advantageous further developments of the technical instruction indicated in the main claim, but also represent separate solutions of the object.

Initially and essentially proposed is a device, in particular in the form of an electronic circuit, which has a group of terminals. Outputs of mechanisms that output signals can be connected to these terminals. The mechanisms can involve PFC's, i.e., safety switches with potential-free contacts, but also OSSD's, i.e., safety devices with clocked outputs. For example, the former can be realized by an emergency off switch of the kind already described above. The latter can be realized by light barriers or light barrier arrays of the kind already discussed above. Both mechanisms can have outputs connected in parallel, in which the potentials applied thereto change synchronously if the state of the mechanism changes, for example from safe to unsafe. The outputs of the safety device can further be high-frequency clocked, so that the safety device can automatically carry out an error recognition and a cross-fault or potential fault monitoring process. According to the invention, the group of terminals has at least one first evaluation terminal and one second evaluation terminal. In particular, it is provided that the first evaluation terminal be connected or connectable with a first output, and the second evaluation terminal with a second output of the mechanism. If the two outputs operate synchronously with each other, the signals applied to the evaluation terminals change symmetrically in pairs. The device further has at least one first and at least one second potential sensor. The potential sensors are capable of imparting a certain potential to the evaluation terminals. According to the invention, this potential depends on the resistance between two terminals, of which at least one is one of the evaluation terminals. If the resistance between the two terminals, which in one variant of the invention can both be evaluation terminals, alternates between a low-ohmic value and a high-ohmic value, the potential alternates between a high value and a low value. The low-ohmic value of the resistance can differ from the high-ohmic value of the resistance by at least a factor of 10. At least one voltage of 1 or 2 volts can be present between the low potential and the high potential. For example, if the mechanism is a safety switch, the two potential-free switches of the safety switch can each connect one of the two evaluation terminals with another terminal of the group of terminals. However, it can also be provided that each channel be connected with two evaluation terminals. The first potential sensor is here wired in such a way as to generate a low potential on the evaluation terminal given a low resistance between the terminals. By contrast, the second potential sensor is wired in such a way as to generate a high potential on the evaluation terminal given a low resistance between the evaluation terminal and another terminal. Because the two evaluation terminals must have opposite potentials to be detected as unsafe, cross-faults can be detected. In an especially preferred embodiment of the invention which also has an independent character, the potential sensor has an operational amplifier. The output of the operational amplifier can here be connected with an evaluation terminal. However, it can also be provided that the inverting or non-inverting input of the operational amplifier be connected with an evaluation terminal. The potential sensors are especially preferably wired in such a way as to wire the resistance between the terminals of the first potential sensor as a negative feedback, and the resistance between the terminals of the second potential sensor as a positive feedback. It can further be provided that the device be wired in such a way that it can distinguish between mechanisms of varying kinds, i.e., between a PFC and an OSSD. It can further be provided that one of the terminals deliver a supply voltage and/or another of the terminals deliver a ground potential. These two terminals can be used to supply an OSSD with an operating voltage. If the device is wired with a PFC, these terminals, or at least one of the terminals, can also act as evaluation terminals. Thus, it is provided in particular that the group of terminals of the device have terminals that perform various functions depending on how they are wired with mechanisms that differ from each other. In particular, it is provided that changing a potential applied to a terminal in the group of terminals switches a switch array. This switch array can influence the potential applied to another terminal. In particular, it is provided that the potential of the other terminal change opposite to the one terminal. In particular, it is provided that the potentials applied to the terminals be digital states, which can be represented by the states zero and one, wherein the zero state corresponds to a low potential, and the one state to a high potential. The two potentials differ in that they lie above or below a reference voltage. In particular, it is provided that the low-ohmic resistance lie under a resistance limit, and the high-ohmic resistance lie above a resistance limit. In particular, it is provided that the two terminals, whose potentials alternatingly change, be allocated to two different potential sensors. The terminal whose potential is altered by changing the potential of another terminal can be allocated to the second potential sensor. A further development of the invention provides that each of the potential sensors have an operational amplifier. The operational amplifier of the first potential sensor can have an output that is connected with a terminal. It can further be provided that the inverting input of the first operational amplifier be connected with another terminal. The non-inverting input of the first operational amplifier can be connected via a resistance with the output of the first operational amplifier, so that the first operational amplifier is switched to the two terminals with a negative feedback. The two terminals can be first evaluation terminals. The output of the second operational amplifier that is allocated to the second potential sensor can be connected with a terminal. The non-inverting input of the second operational amplifier can be connected with another terminal. The inverting input of the second operational amplifier can here be connected with the output of the second operational amplifier via a resistance, so that the two terminals are wired with positive feedback. These two terminals can comprise second evaluation terminals. In an especially preferred further development of the invention, the device also comprises an evaluator, wherein the evaluator consists of a microcontroller or can have a microcontroller or microcomputer. The evaluator has a plurality of inputs. In particular, it is provided that at least several of the evaluation terminals be individually connected with digital inputs of the evaluator, so that the potentials of the terminals can be read directly at the inputs of the evaluator. The circuit according to the invention is preferably designed in such a way that it can distinguish between safe states and unsafe states on the mechanisms hooked up thereto. The device is further wired in such a way as to find single faults. For example, it is provided that, proceeding from an unsafe state, a fault lead to a potential combination at the inputs of the evaluator that are detected as a safe state. As a consequence, single faults cannot make the system unsafe. A fault arises in particular when the otherwise redundant signals of the outputs of the OSSD or the potential-free contacts of the PFC do not change synchronously over time, or at least in the longer term output signals that differ from each other. Therefore, the invention proposes a device for detecting the wiring at a safe input, which can be cost-effectively configured by virtue of the fact that only two operational amplifier circuits and one evaluator are required. As a result of the wiring, the evaluator does not have to be parameterized. It can be operated both with safety switches with potential-free contacts and with safety devices with clocked outputs, for example light barriers. The output signals can likewise be monitored for cross-faults or potential faults. For example, it is essential that two inversely reacting operational amplifier circuits be provided for detecting the wiring at a safe input with two channels. Such an operational amplifier circuit is provided for a respective channel. An operational amplifier is wired to the terminals in such a way that the resistance between the terminals is wired as a positive feedback, so that the voltage on a terminal is high if the resistance between the terminals is low. This is advantageous in particular when using PFC's. A terminal cannot be wired. When using PFC's, this is in particular a terminal connected with a ground, which can serve as a ground supply for using an OSSD. A terminal, for example one that serves as a voltage supply when wired with an OSSD, can be used as an evaluation terminal when wired with a PFC. It is further provided that resistances be applied to the inputs of the operational amplifiers, which can be configured in such a way as to serve as input resistances. The resistances can have a varying level, so as to influence the switching thresholds. While one of the operational amplifiers is wired as a positive feedback, the other operational amplifier is wired as a negative feedback, so that the voltage at one terminal of the second operational amplifier is low if the resistance between two terminals is low. If the respective two potential-free contacts of a PCF are connected to two terminal pairs, the two terminals of a terminal pair are short circuited. The one operational amplifier thus adjusts downward, while the other operational amplifier adjusts upward. The inverse levels detect a cross-fault between the two input signals. A Zener diode can be provided, and used to prescribe the switching threshold. Input resistances can be connected to the two inputs of the operational amplifier in such a way as to realize a filter circuit or protective circuit. An RC wiring for elevating the current at the electric torque for the potential-free contacts can be provided. In a further development of the invention, the mechanism can consist of a safety mat (safety mat). Such a safety mat has two conductive, parallel running, flat bodies, for example films, which in a nonactivated state are electrically separated from each other, i.e., comprise electrodes with a high-ohmic resistance, and which in the activated state, for example when stepping on the safety mat, are connected with each other, so that they connected with each other in a low-ohmic manner. The two electrodes can be connected with a respective one terminal of one of the terminal pairs. A variant of the invention provides that the mechanism be a PP OSSD or a PM OSSD. A further development can provided that a supply terminal, in particular a supply terminal connected to a ground, be connected with the ground via a diode switched in the blocking direction, and with the supply voltage via a high-ohmic resistance. This circuitry makes it possible to detect whether an external ground is hooked up to the supply terminal. The supply voltage can be connected with a digital input of the evaluator. One of the evaluation terminals can be connected with a supply voltage by means of a diode switched in the blocking direction.

BRIEF DESCRIPTION OF THE DRAWINGS

Exemplary embodiments of the invention will be explained below based upon the attached drawings. Shown on:

FIG. 4 is a table 1, which shows switching states with a PFC connected to the circuit;

FIG. 5 is a table 2, which shows switching states with an OSSD connected to the circuit; and FIG. 6 is a table 3, which shows switching states with a safety mat SM connected to the circuit.

DETAILED DESCRIPTION

Figure 1:
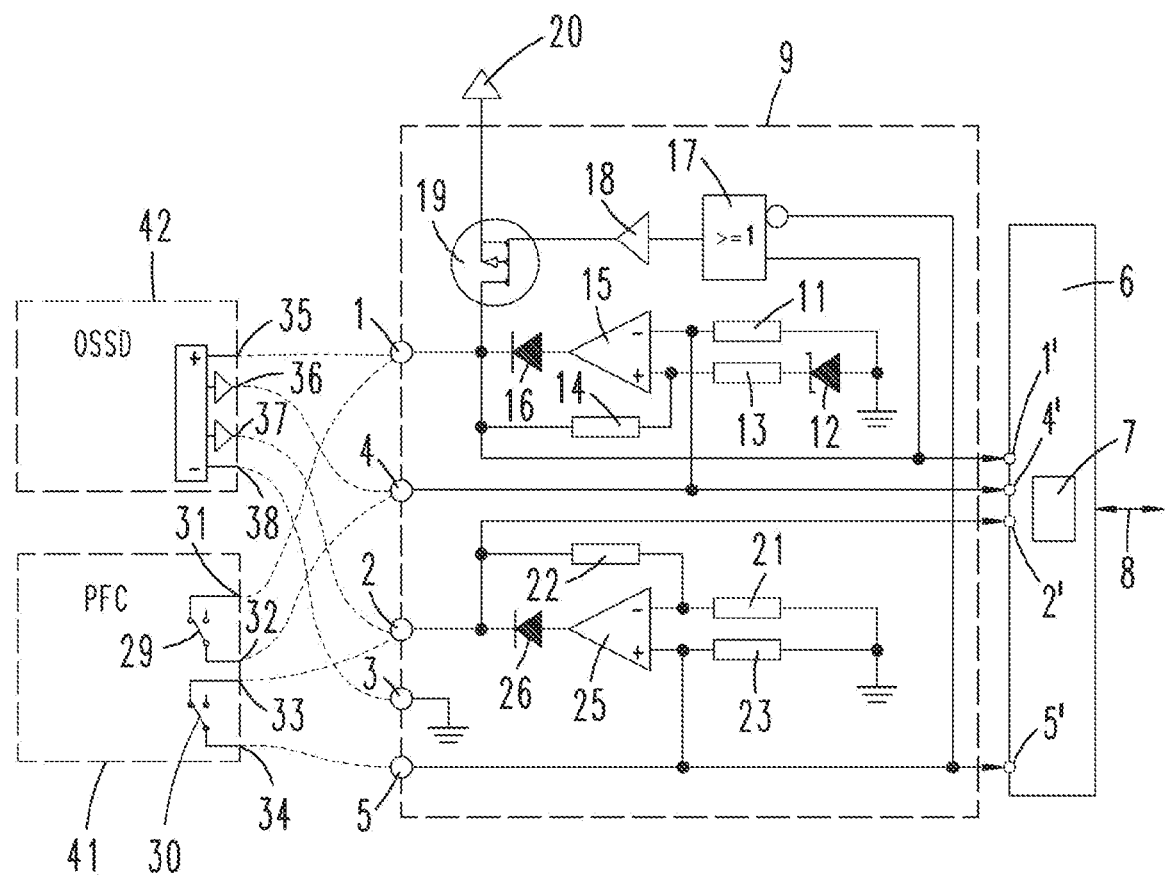
FIG. 1 is a circuit diagram of a first exemplary embodiment.

The circuit 9 has an input side with five terminals 1, 2, 3, 4, 5 and an output side with outputs that are hooked up to inputs 1',2',4',5' of an evaluator 6, wherein the evaluator 6 can have a microcontroller 7 and can be hooked up to other peripheral devices with a data transfer path 8.

A conductive connection can optionally be established between the inputs 1',2',4',5' and various mechanisms 41, 42. The mechanisms 41, 42 can involve a PFC. The latter has two potential-free contacts 29, 30, whose outputs 31, 32, 33, 34 can be connected with the terminals 1, 4 or 2 and 5.

OSSD's 42, for example light barriers or light curtains, can also be used as the mechanisms as an alternative to the PFC's 41. These OSSD's 42 have two input terminals 35, 38 for applying a supply voltage. The latter is made available to the circuit 9 by the terminals 3 and 1. In addition, the OSSD's 42 have two switching outputs 36, 37, which depending on the safety state deliver a high or low potential. The switching outputs 36, 37 are hooked up to the terminals 4 and 2.

As a consequence, several of the terminals 1, 2, 3, 4, 5 can optionally be hooked up to mechanisms 41, 42 that differ from each other, wherein several of the terminals are evaluation terminals. The potential applied thereto can be evaluated by the evaluator 6. Individual terminals 3, 5 can each only be hooked up to one of the mechanisms 41, 42. Individual terminals 1, 4, 2 can be hooked up both to the mechanism 41 and to the mechanism 42.

For example, if a PFC 41 is hooked up to the circuit 9, the terminals 1, 4 are connected with the potential-free contact 29, and the terminals 2, 5 with the potential-free contact 30. If the potential-free contacts 29, 30 are connected with each other, the terminals 2, 5 and 1, 4 are each connected with each other in a low-ohmic manner. The terminals 1, 4 or 2 and 5 are at an identical respective potential. By contrast, if the potential-free contacts 29, 30 are not connected with each other, the resistance between the terminals 2, 5 or 1, 4 is high-ohmic.

The circuit 9 has two channels, which each have an operational amplifier 15, 25. A first channel comprising a first potential sensor has a first operational amplifier 15, whose output is connected with the terminal 1 via a diode 16. The inverting input of the first operational amplifier 15 is connected with the terminal 4. In addition, the non-inverting input of the first operational amplifier 15 is connected with the first terminal 1 via a resistance 14. If the two terminals 1, 4 are connected with each other, the negative feedback circuit of the first potential sensor causes the two terminals 1, 4 to assume a low potential. A PFC 41 can be hooked up to the terminals 1 and 4. If the switches 29, 30 are closed, the terminal pair is short circuited. The operational amplifier 15 adjusts downward. The Zener diode 12 determines that the downward adjustment is not to 0 volts, but to a higher value, but one smaller than the potential, or the level, that is regarded as the high potential. The resistances 11, 14 can be configured in such a way as to serve as input resistances.

The second operational amplifier 25 has an output that is connected with the terminal 2. The terminal 5 is connected with the non-inverting input of the second operational amplifier 25. The inverting input of the operational amplifier 25 is connected with the terminal 2 via the resistance 22. As a result of this positive feedback wiring of the second potential sensor, the two interconnected terminals 2, 5 assume a high potential when the resistance between the terminals 2, 5 is low-ohmic. The resistances 22, 23 can be configured in such a way as to serve as input resistances. Similarly to the first operational amplifier circuit, the resistances 21 and 23 establish a connection between the inputs of the operational amplifier 25 and the ground. If the resistance 21 is 30 times higher than the resistance between the terminals 2 and 5, the upward adjustment of the operational amplifier 25 is 30 times different.

If the PFC 41 is activated, i.e., the outputs 31, 32 or 33, 34 are separated from each other, so that the resistance between the terminals 1, 4 or 2, 5 becomes high-ohmic, the terminal 1 changes its potential from low to high. The potential of the terminal 5 only changes here from high to low. The potential of the terminal 2 changes from high to low.

Because the potential of the terminal 5 changes from high to low, a low potential is applied to the inverting input of a switch 17, as a result of which the actuator 18 of a transistor 19 switches, thus making it conductive. It connects the terminal 1 with the supply voltage. This leads to the potential on the terminal 1 being high.

The terminal 3 is here not wired. By contrast, if an OSSD 42 is hooked up to the circuit 9 instead of a PFC 41, the terminal 5 lies at a low potential. This is because it is connected to ground via the resistance 23. As a result, the transistor 19 conducts, so that the terminal 1 can serve as a voltage supply for the OSSD 42.

The two outputs 36, 37 of the OSSD 42 are connected with the terminals 4 and 2. If the outputs 36, 37 deliver a high potential, the potentials of the terminals 4, 2 are high. The potential of the terminal 5 is low for the reasons mentioned above. The potential of the terminal 1 is high due to the inverse wiring via the switch 17.

If the OSSD 42 is triggered, the potential of the outputs 36, 37 changes, so that a low potential is applied to the terminals 2, 4.

The potentials described above in an unsafe state or safe state are depicted in the two first columns of Tables 1 and 2.

Lines 3 to 6 on Table 1 or 3 to 4 on Table 2 show possible single faults, which are manifested by the fact that the potential-free contacts 29, 30 switch asymmetrically or the outputs 36, 37 output asymmetrical potentials. These switching states depicted on Tables 1, 2 can be viewed as vectors, which are applied to the inputs 1',2',4',5' of the evaluator 6. As evident, the vectors, which each represent an unsafe state, are not reached in the event of a fault.

In addition, the first operational amplifier also has a resistance 11, which connects the inverting input of the first operational amplifier 15 with the terminal 4, as a result of which the unconnected terminal 4 is kept at a low potential. A similar resistance 21 is connected in the second operational amplifier circuit.

The voltages on the terminals 1, 2, 4 and 5 are read and evaluated by the evaluator 6. The latter comprises a logic unit 7, which can contain one or several microcontrollers, digital signal processors, programs, or logic devices. However, it can also be discrete in design. The logic unit 7 processes safety-critical signals with a high safety level. The evaluator 6 also has an interface 8 for communicating with other units. The invention can be used anywhere that digital signals must be read in a functionally safe manner.

Figure 2:
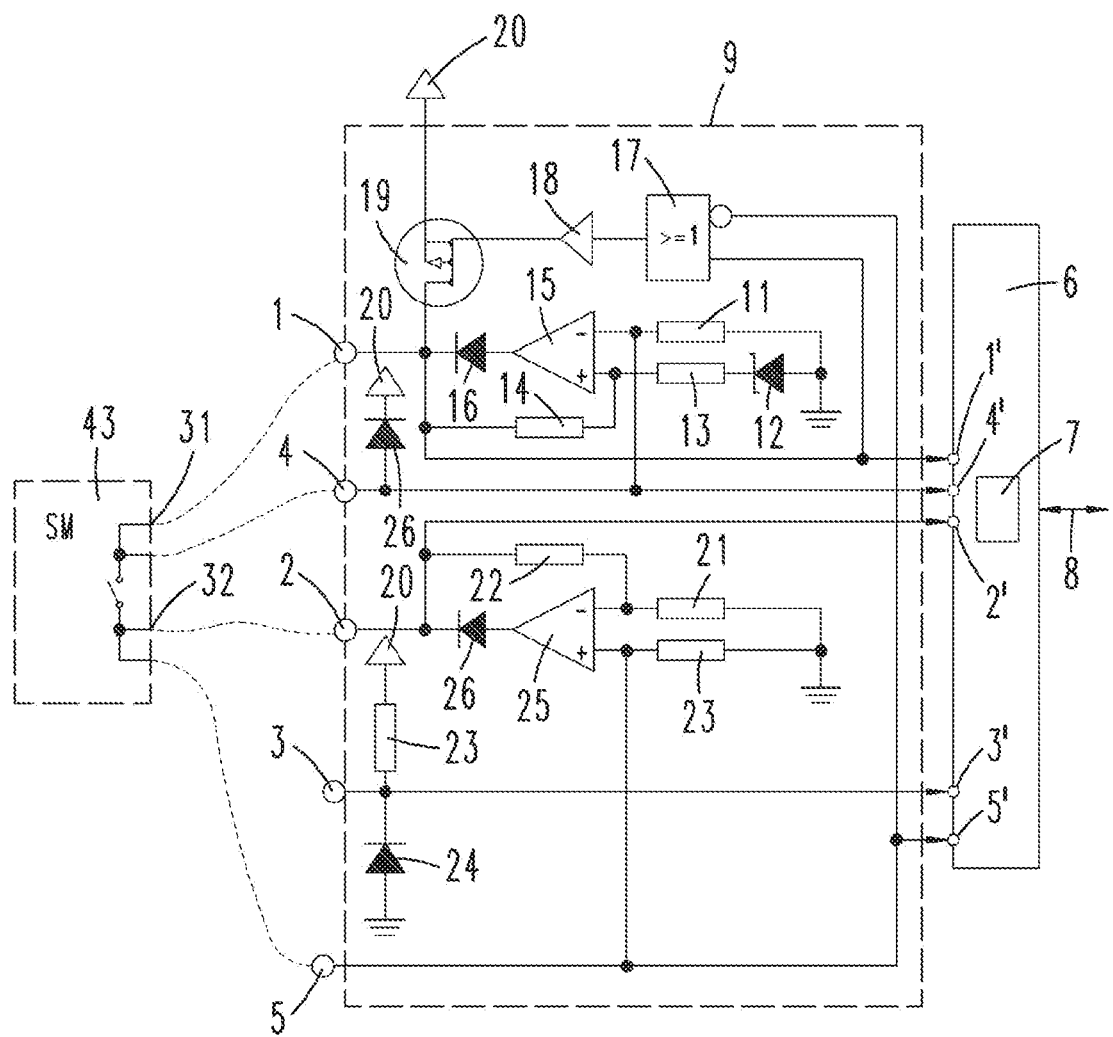
FIG. 2 is a circuit diagram of a second exemplary embodiment.

FIG. 2 shows a variant of the previously described circuit, which essentially differs from the circuit depicted on FIG. 1 in that the supply terminal 3 is connected to ground via a diode 24 switched in the blocking direction, and with the supply voltage 20 via a high-ohmic resistance 23.

The terminal 4 is connected with the supply voltage 20 via a diode 26 switched in the blocking direction.

The mechanism 43 involves a safety mat, which has two electrodes formed by films or the like, which extend parallel to each other spaced slightly apart. In a nonactivated state, the two electrodes are connected with each other in a high-ohmic manner. In an activated state, for example if a person exerts pressure on the safety mat, the two electrodes are short circuited, i.e., are connected with each other in a low-ohmic manner. Of the two electrodes, a first electrode is connected with the terminal 1 and the terminal 4, and the second electrode with the terminals 2 and 5. The terminal 3 is not connected with the device 43, so that it is kept at a high potential by the diode 24.

Table 3 shows the switching states of the assembly shown on FIG. 2. In an unsafe state in which the safety mat is not activated, i.e., the two electrodes are connected with each other in a high-ohmic manner, the terminals 1 and 4 have a low potential, and the terminals 2 and 5 have a high potential. By contrast, if the two electrodes are connected with each other so that the mechanism assumes its safe state, all terminals 1, 2, 4 and 5 are at a high potential. A fault can be detected if neither of the two states is reached.

Figure 3:
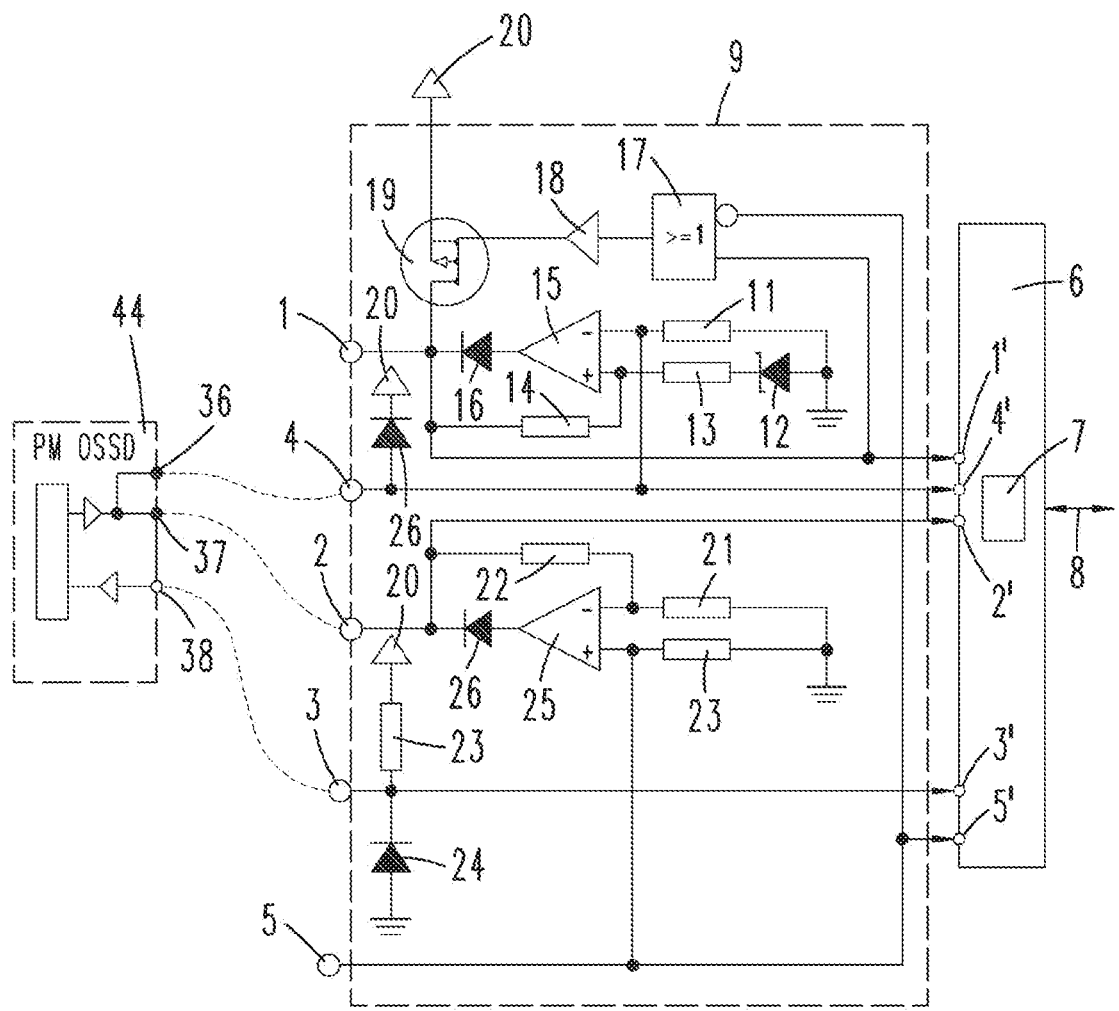
FIG. 3 is a circuit diagram of a third exemplary embodiment.

FIG. 3 shows a third exemplary embodiment, in which a PM OSSD is connected to the circuit as the mechanism 44. As the case with the circuit depicted on FIG. 1, the outputs 36 and 35 are connected with the terminals 4 and 2. The output/input 38 is connected with the terminal 3. If the terminal 38 is grounded, the circuit 9 can be supplied with an external ground, which is then applied to the terminal 3. A low potential can then be applied to the terminal 3'.

In one variant, the terminal 3 cannot be connected with the terminal 38, so that a high potential is applied to the terminal 3 or to the input 3'. The terminal 3 can thus be used to determine whether the circuit 9 is being supplied via an external ground.

The above statements serve to explain the inventions encompassed by the application as a whole, which further develop the prior art at least through the following material combinations and also each taken separately, wherein two, several or all of these feature combinations can also be combined, specifically:

A device having a group of terminals 1, 2, 3, 4, 5 for hooking up a signal-outputting mechanism 41, 42, 43, 44, wherein the group of terminals 1, 2, 3, 4, 5 comprises at least one first evaluation terminal 1, 4, which is set by a first potential sensor 11, 12, 13, 14, 15 to a first potential, which depends on a first resistance between the first evaluation terminal 1, 4 and another one of the group of terminals 1, 2, 3, 4, 5, and wherein the group of terminals 1, 2, 3, 4, 5 comprises at least one second evaluation terminal 2, 5, which is set by a second potential sensor 21, 22, 23, 25, 26 to a second potential, which depends on a second resistance between the second evaluation terminal 2, 5 and another one of the group of terminals 1, 2, 3, 4, 5, wherein the first potential is low if the first resistance is low-ohmic, and the second potential is high if the second resistance is low-ohmic.

A device, characterized in that the two potential sensors each have operational amplifier circuits 15, 25, whose output is connected with a respective one of the evaluation terminals 1, 4; 2, 5.

A device, characterized in that the first resistance is wired to the first potential sensor as a negative feedback, and the second resistance to the second potential sensor as a positive feedback.

A device, characterized in that the potential sensors are wired in such a way that the potential changes between low and high given a change in the resistance allocated to them between low-ohmic and high-ohmic.

A device, characterized in that the device is wired in such way that it can distinguish between mechanisms 41, 42, 43, 44 of varying kinds, wherein the mechanisms 41, 42, 43, 44 are configured in particular as safety switches 41 with two potential-free contacts 29, 30, or as a safety device 42 with two outputs 36, 37 that output a constant or clocked potential.

A device, characterized in that the group of terminals 1, 2, 3, 4, 5 comprises a supply terminal 1, 3 connected to ground and/or a supply voltage.

A device, characterized in that changing a potential applied to a terminal 5 of the group of terminals triggers a change in a switching state of a switch array 17, 18, 19, which in particular inversely changes the potential applied to another terminal 1, wherein it is provided in particular that one 5 of the two terminals 5, 1 be a second evaluation terminal 2, 5, and that the other 1 of the two terminals 5, 1 be a first evaluation terminal.

A device having a group of terminals 1, 2, 3, 4, 5 for hooking up a signal-outputting mechanism 41, 42, 43, 44, wherein the group of terminals 1, 2, 3, 4, 5 comprises at least one first evaluation terminal 1, 4, which is set by a first potential sensor 11, 12, 13, 14, 15 to a first potential, and wherein the group of terminals 1, 2, 3, 4, 5 comprises at least one second evaluation terminal 2, 5, which is set by a second potential sensor 21, 22, 23, 25, 26 to a second potential, wherein the first evaluation terminal 4 is connected with the inverting input of a first operational amplifier 15 of the first potential sensor and/or that the first evaluation terminal 1 is connected with the output of the first operational amplifier 15 and/or that the second evaluation terminal 5 is connected with the noninverting input of a second operational amplifier 25 of the second potential sensor and/or that the second evaluation terminal 2 is connected with the output of the second operational amplifier 25.

A device, characterized in that each of the two potential sensors has allocated to it two evaluation terminals 1, 4; 2, 5, of which one is connected with the output of the operational amplifier 15, 25, and the other with an input of the operational amplifier 15, 25.

A device, characterized in that the device comprises an evaluator 6, which has at least several of the digital inputs 1',2',4',5' individually allocated to the evaluation terminals 1, 4; 2, 5, to which the potentials of the terminals 1, 2, 4, 5 are applied, wherein the potential combinations of the potentials applied to the inputs 1',2',4',5' assume values that are allocated to a safe state of the mechanisms 41, 42, 43, 44 and can accept values that are allocated to an unsafe state of the mechanisms 41, 42, 43, 44, wherein it is further provided in particular that the potential combinations corresponding to a safe state not lead to a potential combination that corresponds to an unsafe state through a change in a potential at one of the inputs 1',2',4',5'.

A device, characterized in that the supply terminal 3 connected to ground lies at a high potential in a state not connected to a mechanism 41, 42, 43, 44, and at a low level in a state connected with a ground of the mechanism 41, 42, 43, 44.

All disclosed features are essential to the invention (separately, but also in combination). The disclosure of the application hereby also completely incorporates the disclosure content of the accompanying/attached priority documents (copy of preliminary application), also for the purpose of including features of these documents in claims of the present application. Even without the features of a referenced claim, the subclaims with their features characterize separate inventive further developments of prior art, in particular so as to generate partial applications based upon these claims. The invention indicated in each claim can additionally have one or several of the features indicated in the above specification, in particular those provided with reference numbers, and/or in the reference list. The invention also relates to embodiments in which individual features mentioned in the above specification have not been realized, in particular to the extent they are obviously unnecessary for the respective intended application or can be replaced by other technically equivalent means.

The invention claimed is:

1. A device having a group of terminals for hooking up a first or a second signal-outputting mechanism, wherein the group of terminals comprises at least one first evaluation terminal, which is set by a first potential sensor to a first potential, which depends on a first resistance of the first signal-outputting mechanism between the first evaluation terminal and another one of the group of terminals, and wherein the group of terminals includes at least one second evaluation terminal, which is set by a second potential sensor to a second potential, which depends on a second resistance of the second signal-outputting mechanism between the second evaluation terminal and another one of the group of terminals, the first evaluation terminal being connected directly with an inverting input of the first potential sensor, wherein a non-inverting input of the first potential sensor is connected to another first evaluation terminal via a first resistor, the second evaluation terminal being connected directly with a non-inverting input of the second potential sensor, wherein an inverting input of the second potential sensor is connected to another second evaluation terminal via a second resistor, wherein the first potential is low if the first resistance is low-ohmic, and the second potential is high if the second resistance is low-ohmic.

2. The device according to claim 1, wherein the two potential sensors each have operational amplifier circuits, whose output is connected with a respective one of the evaluation terminals.

3. The device according to claim 1, wherein the first resistance is wired to the first potential sensor as a negative feedback, and the second resistance to the second potential sensor as a positive feedback.

4. The device according to claim 2, wherein the potential sensors are wired in such a way that the potential changes between low and high given a change in the resistance allocated to them between low-ohmic and high-ohmic.

5. The device according to claim 1, wherein the device is wired in such way that it can distinguish between mechanisms of varying kinds, wherein the mechanisms are configured in particular as safety switches with two potential-free contacts, or as a safety device with two outputs that output a constant or clocked potential.

6. The device according to claim 1, wherein the group of terminals comprises a supply terminal connected to ground and/or a supply voltage.

7. The device according to claim 1, wherein changing a potential applied to a terminal of the group of terminals triggers a change in a switching state of a switch array, which in particular inversely changes the potential applied to another terminal, wherein it is provided in particular that one of the two terminals is a second evaluation terminal, and that the other of the two terminals is a first evaluation terminal.

8. A device having a group of terminals for hooking up a signal-outputting mechanism, wherein the group of terminals comprises at least one first evaluation terminal, which is set by a first potential sensor to a first potential, wherein the first evaluation terminal is connected directly with an inverting input of a first operational amplifier of the first potential sensor, wherein another first evaluation terminal is connected with an output of the first operational amplifier, wherein a second evaluation terminal is connected directly with a non-inverting input of a second operational amplifier of a second potential sensor, and wherein another second evaluation terminal is connected with an output of the second operational amplifier.

9. The device according to claim 8, wherein each of the two potential sensors has allocated to it two evaluation terminals, of which one is connected with the output of the operational amplifier, and the other with an input of the operational amplifier.

10. The device according to claim 1, wherein the device comprises an evaluator, which has at least several of the digital inputs individually allocated to the evaluation terminals, to which the potentials of the terminals are applied, wherein the potential combinations of the potentials applied to the inputs assume values that are allocated to a safe state of the mechanisms and can accept values that are allocated to an unsafe state of the mechanisms, wherein it is further provided in particular that the potential combinations corresponding to a safe state not lead to a potential combination that corresponds to an unsafe state through a change in a potential at one of the inputs.

11. The device according to claim 6, wherein the supply terminal connected to ground lies at a high potential in a state not connected to a mechanism, and at a low level in a state connected with a ground of the mechanism.

12. The device according to claim 8, wherein the device comprises an evaluator, which has several digital inputs individually allocated to the evaluation terminals, to which the potentials of the terminals are applied, wherein the potential combinations of the potentials applied to the inputs assume values that are allocated to a safe state of the mechanisms and can accept values that are allocated to an unsafe state of the mechanisms, wherein it is further provided in particular that the potential combinations corresponding to a safe state not lead to a potential combination that corresponds to an unsafe state through a change in a potential at one of the inputs.

* * * * *